United States Patent
Drolet

(10) Patent No.: US 9,685,635 B2
(45) Date of Patent: Jun. 20, 2017

(54) DISPLAYS HAVING POLARIZING STRUCTURES FORMED USING NARROWBAND DICHROIC DYES

(71) Applicant: Apple Inc., Cupertino, CA (US)

(72) Inventor: Jean-Jacques P. Drolet, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/881,072

(22) Filed: Oct. 12, 2015

(65) Prior Publication Data

US 2016/0197309 A1 Jul. 7, 2016

Related U.S. Application Data

(60) Provisional application No. 62/099,762, filed on Jan. 5, 2015.

(51) Int. Cl.
  *H01L 51/52* (2006.01)

(52) U.S. Cl.
  CPC .................................. *H01L 51/5281* (2013.01)

(58) Field of Classification Search
  None
  See application file for complete search history.

(56) References Cited

U.S. PATENT DOCUMENTS

| | | | |
|---|---|---|---|
| 6,549,335 B1 * | 4/2003 | Trapani | G02B 5/3033 345/32 |
| 7,489,074 B2 | 2/2009 | Antoniadis et al. | |
| 7,965,370 B2 | 6/2011 | Matsumori et al. | |
| 8,679,376 B2 * | 3/2014 | Lee | G02B 5/3033 252/299.62 |
| 8,724,054 B2 | 5/2014 | Jones | |
| 8,879,024 B2 | 11/2014 | Suzuki et al. | |

(Continued)

OTHER PUBLICATIONS

Heo, I., "Display Dynamics Why does AMOLED need polarizers", HIS Markit Sep. 2 2014.*

(Continued)

*Primary Examiner* — Joseph Schoenholtz
(74) *Attorney, Agent, or Firm* — Treyz Law Group, P.C.; Jason Tsai; Zachary D. Hadd

(57) ABSTRACT

A display may have thin-film transistor circuitry on a substrate. An array of organic light-emitting diodes may be formed on the thin-film transistor circuitry. The organic light-emitting diodes may have anodes, cathodes, and emissive material located between the anodes and cathodes. A circular polarizer may be formed over the array of organic light-emitting diodes. The circular polarizer may include a linear polarizer and a quarter wave plate. The linear polarizer may be formed from one or more film layers having narrowband dichroic dyes so that the polarizer exhibits transmission peaks aligned with a selected subset of wavelengths and absorbance notches corresponding to the selected subset of wavelengths. The selected subset of wavelengths may cover the ranges where the light-emitting diodes are outputting light. Configured in this way, the polarizer will exhibit enhanced luminance at the desired wavelengths while suppressing ambient light reflections at other wavelengths in the visible spectrum.

14 Claims, 7 Drawing Sheets

(56) References Cited

U.S. PATENT DOCUMENTS

| | | | | |
|---|---|---|---|---|
| 2010/0072880 A1* | 3/2010 | Adachi | ............... | H01L 27/12 |
| | | | | 313/498 |
| 2014/0078716 A1 | 3/2014 | Ninan et al. | | |
| 2014/0097412 A1* | 4/2014 | Kuo | ............... | G02B 5/30 |
| | | | | 257/40 |
| 2016/0028045 A1* | 1/2016 | He | ............... | H01L 51/524 |
| | | | | 257/40 |

OTHER PUBLICATIONS

Iwanaga, H. "Development of Highly Soluble Anthraquinone Dichroic Dyes and Their Application to Three-Layer Guest-Hose Liquid Crystal Displays", Materials 2009, 2 pp. 1636-1661.*

Definition of "align" downloaded from URL< https://www.merriam-webster.com/dictionary/align> on Feb. 7, 2017.*

Dollendorf et al., "Polymerization of novel methacrylated anthraquinone dyes", Beilstein Journal of Organic chemistry, Feb. 28, 2013, p. 453-459, Dusseldorf, Germany.

Jung, Jennifer, "Guest-Host Dye Systems for Liquid Crystal Electro-Optical Device Applications", Laboratory for Laser Energetics, 2001, University of Rochester.

Wanaga, Hiroki, "Development of Highly Soluble Anthraquinone Dichroic Dyes and Their Application to Three-Layer Guest-Host Liquid Crystal Displays", Materials, Oct. 23, 2009, p. 1636-1661.

* cited by examiner

DISPLAYS HAVING POLARIZING STRUCTURES FORMED USING NARROWBAND DICHROIC DYES

This application claims the benefit of provisional patent application No. 62/099,762 filed on Jan. 5, 2015, which is hereby incorporated by reference herein in its entirety.

BACKGROUND

This relates generally to electronic devices with displays, and, more particularly, to organic light-emitting diode displays.

Electronic devices often include displays. Displays such as organic light-emitting diode displays have pixels with light-emitting diodes. The light emitting diodes each have an anode and a cathode. Emissive material is interposed between the anode and cathode. During operation, current passes between the anode and the cathode through the emissive material, generating light.

The anodes in an organic light-emitting diode display are formed from a photolithographically patterned layer of metal. Unlike other metal structures in a display such as signal lines that may be covered with opaque masking material, the anodes are exposed. The anodes may therefore give rise to strong specular light reflections. This may cause ambient light to be reflected towards a viewer. These reflections can make it difficult to view images on the display. Ambient light reflections may be suppressed by covering a display with a circular polarizer, but use of a circular polarizer can significantly reduce light emission efficiency.

It would therefore be desirable to be able to provide organic light-emitting diode displays with enhanced light emission efficiency.

SUMMARY

An organic light-emitting diode display may have an array of light-emitting diodes that form an array of pixels. The array of pixels may be used to display images for a viewer. Each light-emitting diode may have a layer of emissive material interposed between an anode and a cathode. When current is passed between the anode and the cathode through the emissive material, the light-emitting diode will emit light.

Thin-film transistor circuitry may be used to form pixel circuits that control the current applied through the light-emitting diode of each pixel. The thin-film transistor circuitry may include transistors and thin-film capacitors and may be formed from semiconductor layers, dielectric layers, and metal layers on a substrate. Ambient light that shines on the display may be reflected by at least some of the exposed thin-film transistor circuitry.

In accordance with an embodiment, a circular polarizer may be formed on the thin-film transistor circuitry to help suppress ambient light reflections. The circular polarizer may include a linear polarizer and a quarter wave plate. The linear polarizer may be formed using narrowband dichroic dyes that exhibit one or more absorption notches aligned to the emission spectra of the pixel circuits.

For example, consider a scenario in which the light-emitting diode display includes first pixels that emit light at a first wavelength (e.g., blue light), second pixels that emit light at a second wavelength that is different than the first wavelength (e.g., green light), and third pixels that emit light at a third wavelength that is different than the first and second wavelengths (e.g., red light). The circular polarizer may exhibit a transmission profile for light passing through the polarizer from the pixels that has at least a first peak aligned to the first wavelength, a second peak aligned to the second wavelength, and a third peak aligned to the third wavelength. Arranged in this way, the transmission peaks provide at least a 10% luminance boost for the light produced by the pixels at the first, second, and third wavelengths relative to light at other wavelengths. Such types of circular polarizers may also suppress ambient light reflections except for ambient light at the first, second, and third wavelengths.

DETAILED DESCRIPTION

Figure 1:
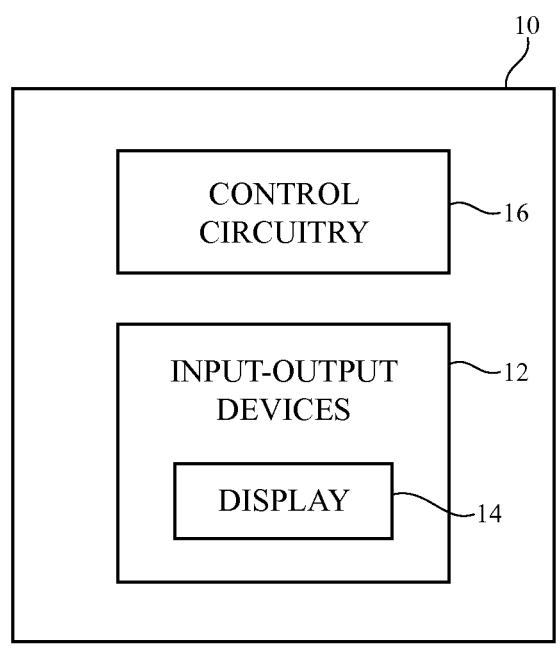
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
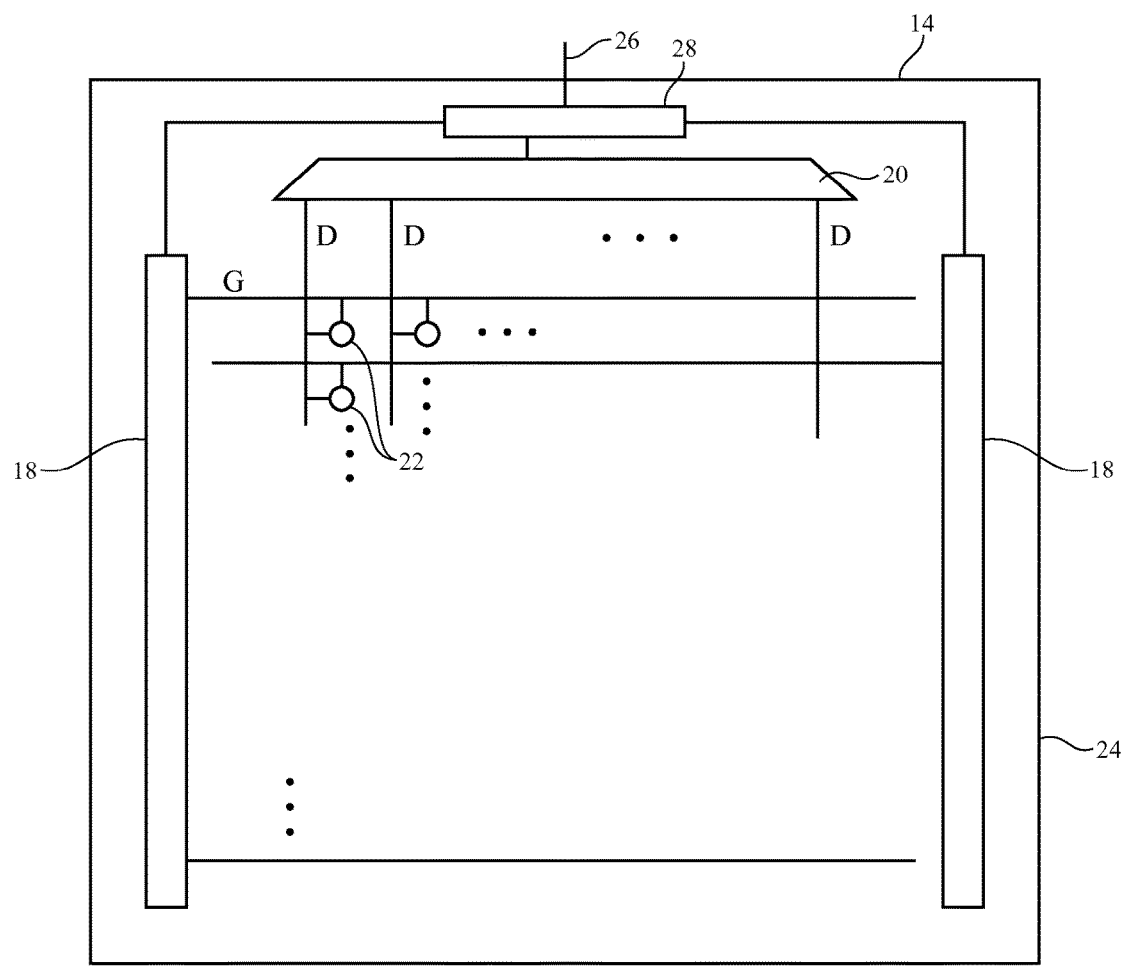
FIG. 2 is diagram of an illustrative display pixel array in accordance with an embodiment.

A top view of a portion of display 14 is shown in FIG. 2. As shown in FIG. 2, display 14 may include layers such as substrate layer 24. Substrate layers such as layer 24 may be formed from planar rectangular layers of material such as planar glass layers, planar polymer layers, composite films that include polymer and inorganic materials, metallic foils, etc. Substrate 24 may have left and right vertical edges and upper and lower horizontal edges. If desired, substrates such as substrate 24 may have non-rectangular shapes (e.g., shapes with curved edges, etc.).

Display 14 may have an array of pixels 22 for displaying images for a user. Each pixel may have a light-emitting diode such as an organic light-emitting diode and associated thin-film transistor circuitry. This is merely illustrative. Other types of display pixels such as liquid crystal display (LCD) pixels, plasma display pixels, and electronic ink display pixels may be used in display 14. Pixels 22 may be arranged in rows and columns. There may be any suitable number of rows and columns in the array of pixels 22 (e.g., ten or more, one hundred or more, or one thousand or more). Display 14 may include pixels 22 of different colors. As an example, display 14 may include red pixels that emit red light, green pixels that emit green light, blue pixels that emit blue light, and white pixels that emit white light. Configurations for display 14 that include pixels of other colors (e.g., cyan, magenta, yellow, etc.) may be used, if desired.

Figure 3:
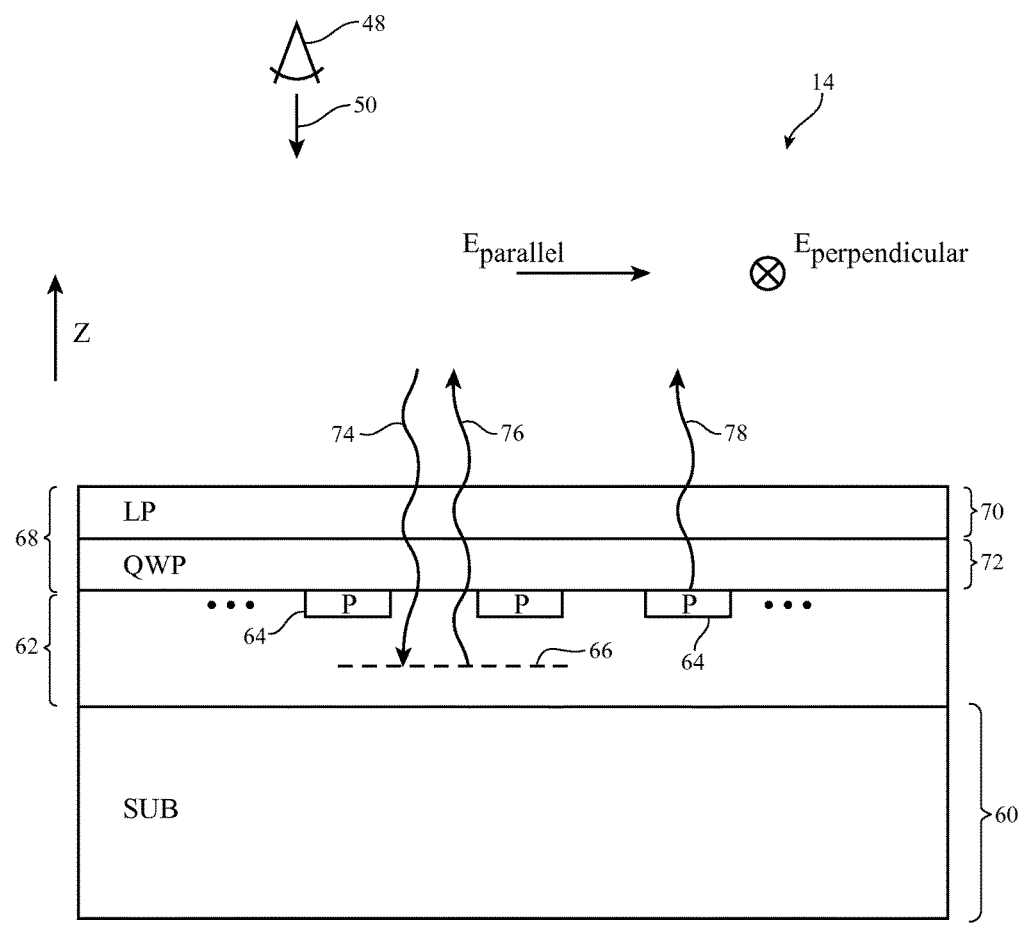
FIG. 3 is a cross-sectional side view of a portion of an illustrative display layers in accordance with an embodiment.

Display driver circuitry may be used to control the operation of pixels 22. The display driver circuitry may be formed from integrated circuits, thin-film transistor circuits, or other suitable circuitry. As shown in FIG. 3, display driver integrated circuit 28 may contain communications circuitry for communicating with system control circuitry over path 26. Path 26 may be formed from traces on a flexible printed circuit or other cable. The control circuitry may be located on one or more printed circuits in electronic device 10. During operation, the control circuitry (e.g., control circuitry 16 of FIG. 1) may supply circuitry such as display driver integrated circuit 28 with information on images to be displayed on display 14. Circuits such as display driver integrated circuits may be mounted on substrate 24 or may be coupled to substrate 24 through a flexible printed circuit cable or other paths. The circuitry of display driver integrated circuits such as circuit 28 may also be provided using thin-film transistor circuitry on substrate 24.

To display the images on display pixels 22, display driver circuitry 28 may supply corresponding image data to data lines D while issuing clock signals and other control signals to supporting display driver circuitry such as gate driver circuitry 18 and demultiplexing circuitry 20.

Demultiplexer circuitry 20 may be used to demultiplex data signals from circuit 28 onto a plurality of corresponding data lines D. With the illustrative arrangement of FIG. 3, data lines D run vertically through display 14. Data lines D are associated with respective columns of display pixels 22. Demultiplexer circuitry 20 may be implemented as part of an integrated circuit such as circuit 28 and/or may be formed from thin-film transistor circuitry on substrate 24.

Gate driver circuitry 18 (sometimes referred to as scan line driver circuitry) may be implemented as part of an integrated circuit such as circuit 28 and/or may be implemented using thin-film transistor circuitry on substrate 24. Gate lines G (sometimes referred to as scan lines or horizontal control lines) run horizontally through display 14. Each gate line G is associated with a respective row of display pixels 22. If desired, there may be multiple horizontal control lines such as gate lines G associated with each row of display pixels. Gate driver circuitry 18 may be located on the left side of display 14, on the right side of display 14, or on both the right and left sides of display 14, as shown in FIG. 2.

Gate driver circuitry 18 may assert control signals on the gate lines G in display 14. For example, gate driver circuitry 18 may receive clock signals and other control signals from circuit 28 and may, in response to the received signals, assert a gate signal on gate lines G in sequence, starting with the gate line signal G in the first row of display pixels 22. As each gate line is asserted, data from data lines D is located into the corresponding row of display pixels. In this way, control circuitry such as display driver circuitry 28, 20, and 18 may provide display pixels 22 with signals that direct display pixels 22 to generate light for displaying a desired image on display 14. If desired, more complex control schemes may be used to control display pixels using multiple thin-film transistors (e.g., to implement threshold voltage compensation schemes).

Display circuits such as demultiplexer circuitry 20, gate line driver circuitry 18, and the circuitry of display pixels 22 may be formed using thin-film transistors on substrate 24 such as silicon-based transistors such as polysilicon thin-film transistors, semiconducting-oxide-based transistors such as InGaZnO transistors, or other thin-film transistor circuitry.

A cross-sectional side view of a configuration that may be used for the pixels of display 14 of device 10 is shown in FIG. 3. As shown in FIG. 3, display 14 may have a thin-film transistor substrate such as substrate 60. Substrate 60 may be formed from a transparent layer of glass, plastic, ceramic, sapphire, metal, or other clear substrate material.

Additional display layers including display pixel circuitry 62 may be formed over substrate 60. Circuitry 62 may include pixels 64 having light-emitting diodes formed in an array configuration as described above in FIG. 2. Pixels 62 may include red pixels that emit red light, green pixels that emit green light, blue pixels that emit blue light, and/or white pixels that emit white light (as examples). During operation, light emitted from pixels 64 (vertically upwards in dimension Z in the orientation of FIG. 3) to illuminate any images that are being produced by the display pixels for viewing by a user. For example, light 78 produced from pixels 64 may illuminate images on display layers 62 that are being viewed by a viewer 48 in direction 50.

Other display circuitry structures such as emissive structures associated with light-emitting diodes, color filter elements, planarization layers (e.g., a clear polymer layer or other transparent dielectric layer), organic buffer layers, opaque light-blocking structures (e.g., pixel definition layers and black border masking layers), thin-film transistors, capacitors, and/or other thin-film transistor circuitry may optionally be formed as part of layers 62. In the scenario in which display 14 includes organic light-emitting diodes (OLEDs), each OLED pixel may include anode and cathode electrodes.

In some embodiments, the anodes are formed from a transparent material (e.g., indium tin oxide), whereas the cathodes are configured as a blanket layer formed from reflective material (e.g., a mirror cathode formed from aluminum, copper, tungsten, other metals, or other reflective conductive structures). In other embodiments, the cathodes are formed from transparent material, whereas the anodes are configured as a reflective blanket layer. In yet other arrangements, at least a portion of the anode and/or cathode overlaps with a substantial portion of the surface area of substrate 60 and is formed from reflective material. Such type of reflective structures (as represented by lines 66 in FIG. 3) can reflect ambient light (see, incoming ambient light 74 and reflected ambient light 76) and can cause specular light reflections and glare on the display.

Ambient light reflections from metal lines such as lines 66 of FIG. 3 may be suppressed by forming a circular polarizer such as circular polarizer 68 over the array of display pixels 64. Adhesive material (not shown) may be used to attach circular polarizer 68 to layers 62. Circular polarizer 68 may include a linear polarizer layer such as linear polarizer (LP) layer 70 and a quarter wave plate (QWP) such as layer 72 for converting linearly polarized light into circularly polarized light.

A conventional circular polarizer layer can help suppress ambient light reflections from reflective structures in layers 62, but has the potential to reduce the amount of emitted light 78 from layer pixels 64 that reaches viewer 48. In particular, the amount of light 78 that passes through a polarizer layer will depend on the polarization state of that light (e.g., parallel to the linear polarizer 70 as illustrated by electric field orientation Eparallel of FIG. 3 or perpendicular to the linear polarizer 70 as illustrated by electric field orientation Eperpendicular of FIG. 3). The use of a circular polarizer may be effective at reducing ambient light reflections, but a conventional circular polarizer will absorb about 40-60% of the light emitted by the display pixels 64 and therefore will reduce display efficiency. Moreover, the display contrast ratio, dynamic range, and the readability of the display in environments with an abundant amount of ambient light will be degraded by the presence of the circular polarizer.

It would therefore be desirable to provide a circular polarizer with improved light transmission efficiency while still being able to help suppress ambient light reflections. In accordance with an embodiment, circular polarizer 68 may be configured to exhibit spectral discrimination between ambient light and the light generated from an internal light source of the display (e.g., from light-emitting diodes, from a backlight unit, or from other light sources). For example, if the internal display light source exhibits narrowband spikes at a particular set of wavelength values, the circular polarizer can be adapted to exhibit heightened light transmission levels that those particular wavelength values while still exhibiting high absorption at other visible wavelengths to ensure that the ambient light reflections are minimized.

Figure 4:
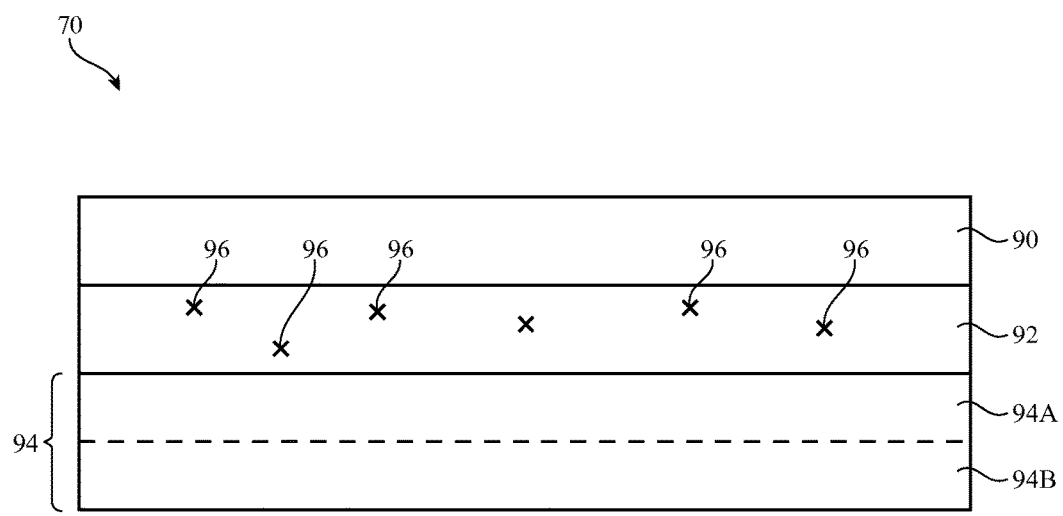
FIG. 4 is a cross-sectional side view of a polarizer in accordance with an embodiment.

In one suitable arrangement, linear polarizer 70 may be formed from multiple layers of material that are laminated together. An illustrative laminated polarizer is shown in the cross-sectional side view of FIG. 4. As shown in FIG. 4, polarizer 70 may have polarizer film (layer) 92. Film 92 may be formed from a stretched polymer such as stretched polyvinyl alcohol (PVA) or may be formed using a liquid-crystal polymer host.

Polarizer film 92 may be sandwiched between layers 90 and 94. Layers 90 and 94 may be formed from clear polymers. For example, layer 90 may be formed from a material such as tri-acetyl cellulose (TAC) and may sometimes be referred to as a TAC film. The TAC film or other supporting substrate may help support and protect the polarizer film 92. Other films may be laminated to film 92 if desired. For example, lower film(s) 94 may be formed from one or more compensation films 94A and 94B (i.e., birefringent films that help enhance off-axis viewing performance for display 14). Adhesive layers may be used to hold laminated films together. Functional layers such as antiscratch layers, antismudge layers, antireflection layers, and/or other layers may be coated on a polarizer (e.g., on the upper surface of layer 70), if desired.

To provide polarizer 70 with the ability to polarize light, one or more types of dichroic dyes such as dye 96 may be added to the liquid crystalline host layer 92. Dye 96 may be used to dope layer 92 or may otherwise be dissolved in the liquid crystalline host. Molecules of dye 96 align prior to polymerization and form the active polarizing layer of polarizer 70. In general, dye 92 may be any suitable type of dye or combination of dyes that can give the polarizer selective wavelength passing/filtering characteristics. For example, dye 96 may be a highly soluble anthraquinone dichroic dyes or other suitable narrowband dichroic dyes.

Figure 5:
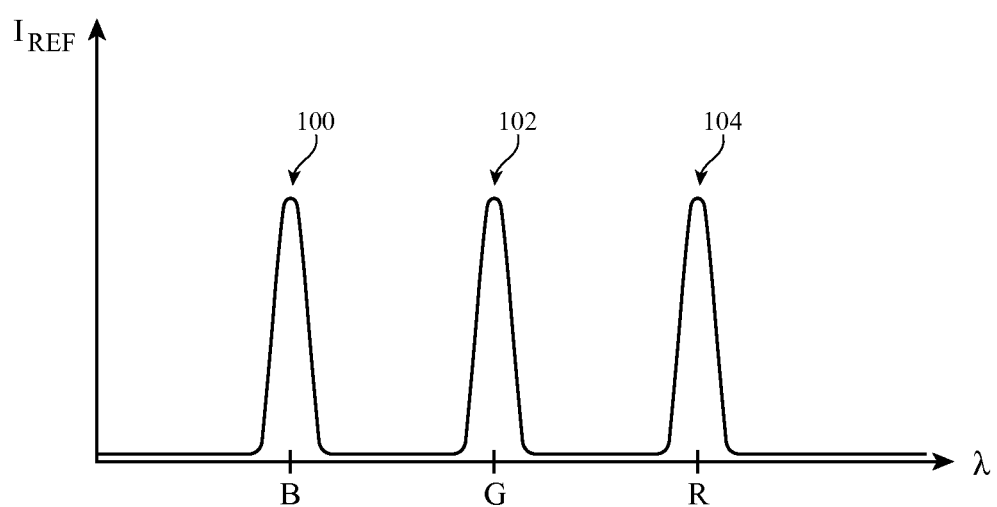
FIG. 5 is a diagram plotting the intensity of reflected ambient light passing through a display polarizer of the type shown in connection with FIG. 4 as a function of wavelength in accordance with an embodiment.

FIG. 5 is a plot showing the intensity of reflected ambient light ($I_{REF}$) associated with displays having the polarizing structure of FIG. 4. Particular dyes may be chosen such that the resulting polarizer will yield light intensity peaks at desired wavelengths. In the example of FIG. 4, the polarizer may be configured such that $I_{REF}$ exhibits a first peak 100 near the blue wavelength values (e.g., around 450 nm), a second peak 102 near the green wavelength values (e.g., around 550 nm), and a third peak 104 near the red wavelength values (e.g., around 700 nm). A polarized configured in this way will act like a normal circular polarizer to suppress ambient light reflections for most of the visible spectrum except for selective wavelength ranges corresponding to peaks 100, 102, and 104. In other words, the polarizer will have narrowband "transparent" windows at a subset of wavelengths for the reflected ambient light.

The example of FIG. 5 in which the $I_{REF}$ plot has three peaks corresponding to blue light, green light, and red light is merely illustrative and is not intended to limit the scope of the present invention. In other suitable embodiments, the polarizer may be configured such that $I_{REF}$ exhibits at least one peak, at least two peaks, more than three peaks, or more than four peaks at a subset of wavelengths in the visible spectrum between 390 nm to 750 nm. The peaks in $I_{REF}$ are preferably positioned away from typical fluorescent light wavelengths or other common ambient light wavelengths to achieve optimal tradeoff between output transmission and ambient light suppression.

Figure 6:
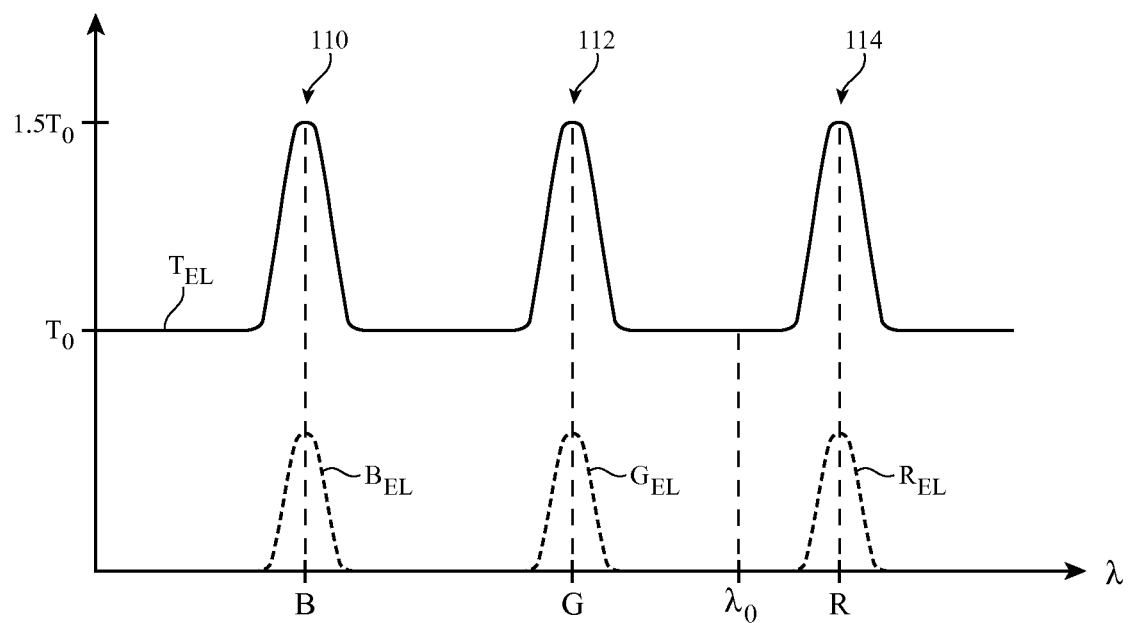
FIG. 6 is a diagram plotting the transmission characteristic of light emitted from a display passing through a polarizer of the type shown in connection with FIG. 4 as a function of wavelength in accordance with an embodiment.

The polarizer described in connection with the example of FIG. 5 may be suitable for a display with light sources having narrowband emission peaks or "spikes" at the blue, green, and red wavelengths. FIG. 6 shows a blue light emission spike $B_{EL}$ that can be output from blue display pixels, a green light emission spike $G_{EL}$ that can be output from green display pixels, and a red light emission spike $R_{EL}$ that can be output from red display pixels.

As shown in FIG. 6, the associated polarizer should be configured such that the output transmission characteristic $T_{EL}$ for light emitted internally by the display pixels exhibits spectral peaks that are aligned with the output emission of the internal display light sources. In the example of FIG. 6, the transmission profile $T_{EL}$ of the polarizer structure has a first peak 110 that is aligned to the blue pixel emission $B_{EL}$, a second peak 112 that is aligned to the green pixel emission GEL, and a third peak 114 that is aligned to the red pixel emission $R_{EL}$. At wavelengths other than the pixel emission wavelengths such as at $\lambda_0$, the polarizer may exhibit an output transmission level of $T_0$. At wavelengths corresponding to the narrowband spikes 110, 112, and 114, the polarizer may exhibit an output transmission level of $1.5*T_0$. In other words, any light that is being output at pixel emission wavelengths corresponding to the peaks in $T_{EL}$ will exhibit a luminance boost of 50% (as an example). A boost of 50% from the nominal transmission level is merely illustrative. In certain embodiments, the peak may exhibit a boost of at least 10%, at least 20%, at least 30%, at least 40%, or more than 50%. A boost in transmission provided as such can help to compensate for the loss in efficiency introduced via use of the circular polarizer to suppress ambient light reflections, thereby increasing the contrast ratio and the dynamic range of display 14.

Figure 7:
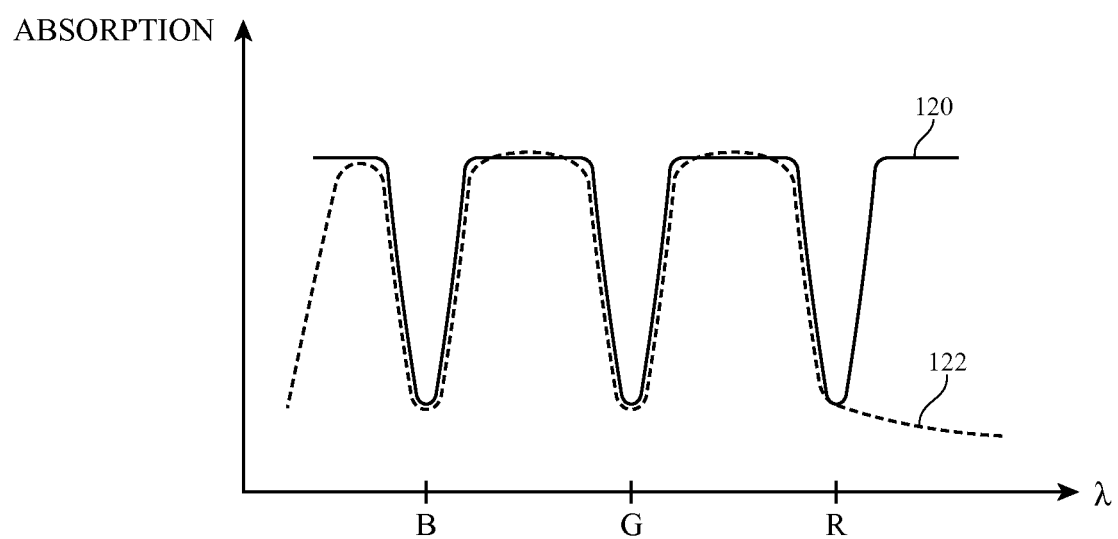
FIG. 7 is a diagram plotting the absorption characteristic of narrowband dichroic dye(s) that can be used in the polarizer of FIGS. 3 and 4 in accordance with an embodiment.

FIG. 7 shows the absorption spectrum for dichroic dyes that can be used in forming polarizer structures exhibiting the narrowband characteristics described in connection with FIGS. 4-6. Curve 120 may represent a first absorption spectrum having dips or "notches" that are also aligned to the output emission wavelengths of the internal display light sources (e.g., assuming that the display generates blue light, green light, and red light). In other words, the polarizer may exhibit relatively low absorbance at a selected subset of wavelengths corresponding to light generated by the light-emitting diodes or other types of display light sources while exhibiting high absorbance at the other wavelengths in the visible spectrum. The notches or troughs in the absorption spectrum may be at least a 10% dip, at least a 20% dip, at least a 30% dip, more than 50% fall off, more than 70% drop, or more than 90% roll off relative to absorption at other visible wavelengths.

The absorption spectrum as illustrated by curve 120 is merely illustrative. Dotted curve 122 may represent another suitable absorption spectrum having notches that are only aligned to the blue and green wavelengths. As shown in FIG. 7, curve 122 may also exhibit low absorbance values for light in the ultraviolet (UV) range (i.e., between 10 nm and 400 nm) and low absorbance values for red light as well as infrared light. In the example of FIG. 7, curve 122 may dip at around 700 nm and may remain low for at least up to 1000 nm (as an example).

In at least some embodiments, the overall absorption spectrum of the polarizer may be obtained by combining the absorption spectra of one or more individual dyes. For example, a dye having a spectral absorption crest centered in the cyan wavelength (i.e., between the blue and green wavelengths) and another dye having a spectral absorption crest centered at the yellow-orange wavelengths (i.e., between the green and red wavelengths) can be combined to yield an absorption dip aligned to the green wavelengths with low absorption tails in the blue and red wavelengths (see, e.g., curve 122 in FIG. 7). This is merely illustrative. In general, any combination of dyes (e.g., two or more types of dyes, three or more types of dyes, four or more types of dyes, etc.) may be used to obtain crests, notches, and/or continued low absorption roll-off at the desired wavelengths.

The embodiments of FIG. 5-7 in which the polarizer structure exhibits narrowband transmission peaks at only the blue, green, and red wavelengths are merely illustrative and are not intended to limit the scope of the present invention. In general, a circular polarizer may be formed using any suitable narrowband dichroic dye(s) such that the polarizer exhibits transmission spikes that are aligned to at least some of the pixel output spectra. As an example, a display 14 may include a circular polarizer formed using dichroic dyes having low absorption characteristics at only the blue wavelength. Configured as such, only blue light output from the pixels will exhibit a luminance boost while the red and green light will suffer from loss in efficiency when passing through the circular polarizer.

Consider another example in which display 14 includes only first pixels that output blue light and second pixels that output red light. In such scenarios, display 14 may be provided with a circular polarizer formed using dichroic dyes having low absorption values at only the blue and red wavelengths (e.g., so that the polarizer will exhibit transmission peaks at only the blue and red wavelengths). Formed in this way, the light generated from both the first and second pixels will exhibit a luminance boost while reflected ambient light at all other wavelengths in the visible spectrum should be suppressed.

Consider yet another example in which display 14 includes first pixels that output cyan light, second pixels that output magenta light, and third pixels that output yellow light. In such scenarios, display 14 may include a circular polarizer formed using dichroic dyes having low absorbance values at only the cyan, magenta, and yellow wavelengths (e.g., so that the polarizer exhibits transmission peaks at only the cyan, magenta, and yellow wavelengths). Formed in this way, the light generated from the first, second, and third pixels in display 14 will exhibit improved transmission while reflected ambient light at all other wavelengths in the visible spectrum will be minimized.

Consider a generalized example in which display 14 includes first display pixels that output light of a first color, second display pixels that output light of a second color that is different than the first color, third display pixels that output light of a third color that is different than the first and second colors, and fourth display pixels that output light of a fourth color that is different than the first, second, and third colors. In this example, display 14 may include a circular polarizer formed using dichroic dyes having low absorbance values at wavelengths for at least some of the four colors (e.g., the polarizer may exhibit absorption notches corresponding to light of only one of the four colors, to light of at least two of the four colors, to light of at least three of the four colors, or to light of all four colors). Configured in this way, the circular polarizer will suppress ambient light reflections at all visible wavelengths except for those corresponding to the absorption notches. In other words, the polarizer may exhibit output transmission peaks corresponding to wavelengths associated with only one of the four colors of light, to at least two of the four colors of light, to at least three of the four colors of light, or to all four colors of light.

This generic example in which display 14 includes four different types of display pixels is merely illustrative. The principles described herein may be applied to displays with fewer than four different types of pixels or more than four different types of pixels without loss of generality.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
   a substrate;
   a pixel that is formed on the substrate and that emits light at a given wavelength; and
   a circular polarizer that is formed over the pixel and that exhibits a transmission profile for light passing through the circular polarizer from the pixel, wherein the transmission profile has at least one peak at the given wavelength, and wherein the circular polarizer comprises narrowband dichroic dyes that allow light at the given wavelength to pass through the circular polarizer while blocking light at other wavelengths.

2. The display defined in claim 1, wherein the circular polarizer comprises:
   a linear polarizer; and
   a quarter wave plate.

3. The display defined in claim 2, further comprising:
   a first additional pixel that is formed on the substrate and that emits light at a first wavelength that is different than the given wavelength, wherein the transmission profile of the circular polarizer exhibits at least a first additional peak at the first wavelength.

4. The display defined in claim 3, further comprising:
   a second additional pixel that is formed on the substrate and that emits light at a second wavelength that is different than the given wavelength and the first wavelength, wherein the transmission profile of the circular polarizer exhibits at least a second additional peak at the second wavelength.

5. The display defined in claim 2, wherein the linear polarizer is formed from the narrowband dichroic dyes.

6. The display defined in claim 5, wherein the linear polarizer is configured to exhibit an absorbance spectrum having at least one notch that is aligned to the given wavelength.

7. The display defined in claim 1, wherein the circular polarizer is configured such that the at least one peak provides at least a 10% luminance boost relative to transmission at other wavelengths.

8. The display defined in claim 1, wherein the circular polarizer is configured such that the at least one peak provides at least a 20% luminance boost relative to transmission at other wavelengths.

9. Display circuitry, comprising:
   a pixel that produces light at a given wavelength; and
   a circular polarizer formed over the pixel to suppress ambient light reflections, wherein the circular polarizer is formed from polarizing material having at least one absorption notch aligned to the given wavelength, and wherein the polarizing material comprises a narrowband dichroic dye that transmits light at the given wavelength while absorbing light having wavelengths outside of the absorption notch.

10. The display circuitry defined in claim 9, further comprising:
    a first additional pixel that produces light at a first wavelength that is different than the given wavelength, wherein the polarizing material also exhibits low absorption values at the first wavelength.

11. The display circuitry defined in claim 10, further comprising:
    a second additional pixel that produces light at a second wavelength that is different than the given wavelength and the first wavelength, wherein the polarizing material also exhibits low absorption values at the second wavelength.

12. The display circuitry defined in claim 11, wherein the given wavelength comprises the blue wavelength, wherein the first wavelength comprises the green wavelength, and wherein the second wavelength comprises the red wavelength.

13. The display circuitry defined in claim 12, wherein the circular polarizer suppresses ambient light reflections for all visible wavelengths except for light at the given, first, and second wavelengths.

14. The display circuitry defined in claim 9, wherein the pixel includes an organic light-emitting diode.

\* \* \* \* \*